United States Patent
Kuo et al.

(10) Patent No.: US 7,230,279 B2
(45) Date of Patent: Jun. 12, 2007

(54) MEMORY CARD

(75) Inventors: Cheng-Hsien Kuo, Taipei Hsien (TW);
Ming-Jhy Jiang, Taipei (TW);
Cheng-Kang Yu, Taipei County (TW);
Hui-Chuan Chuang, Tainan County (TW)

(73) Assignee: Advanced Flash Memory Card Technology Co., Ltd., Taipei (TW)

( * ) Notice: Subject to any disclaimer, the term of this patent is extended or adjusted under 35 U.S.C. 154(b) by 0 days.

(21) Appl. No.: 10/904,974

(22) Filed: Dec. 8, 2004

(65) Prior Publication Data

US 2006/0071313 A1 Apr. 6, 2006

(30) Foreign Application Priority Data

Oct. 6, 2004 (TW) ............... 93130203 A

(51) Int. Cl.
*H01L 27/15* (2006.01)
(52) U.S. Cl. ............. 257/81; 257/99; 257/100; 257/E23.007; 257/E23.038
(58) Field of Classification Search ............. 257/99, 257/100, E51.023, E23.007, E23.038, 81
See application file for complete search history.

(56) References Cited

U.S. PATENT DOCUMENTS

| 5,324,473 | A * | 6/1994 | Baresich ............... 264/327 |
| 5,709,065 | A * | 1/1998 | Krause ............... 53/400 |
| 6,462,273 | B1 * | 10/2002 | Corisis et al. ............... 174/521 |
| 6,730,995 | B2 * | 5/2004 | Bolken ............... 257/679 |
| 7,023,702 | B2 * | 4/2006 | MacGregor ............... 361/719 |
| 2002/0131251 | A1 | 9/2002 | Corisis et al. ............... 360/760 |
| 2003/0209793 | A1 * | 11/2003 | Nishizawa et al. ............... 257/679 |

* cited by examiner

*Primary Examiner*—Thao P. Le
(74) *Attorney, Agent, or Firm*—Jianq Chyun IP Office

(57) ABSTRACT

A memory card is provided. The memory card comprises a substrate, a plurality of electronic package devices, a molding compound and a plastic forming material. The substrate has at least a plurality of outer contacts and a plurality of inner contacts and the outer contacts are electrically connected to the inner contacts. The electronic package devices are located on the substrate and the electronic package devices electrically connect to the inner contacts, respectively. The molding compound is covering the electronic package devices and the corresponding inner contacts. The plastic forming material is covering the molding compound and the substrate, and the plastic forming material exposes the outer contacts.

10 Claims, 2 Drawing Sheets

MEMORY CARD

CROSS-REFERENCE TO RELATED APPLICATION

This application claims the priority benefit of Taiwan application serial no. 93130203, filed Oct. 6, 2004.

BACKGROUND OF THE INVENTION

1. Field of Invention

The present invention relates to a memory device and a method for manufacturing thereof. More particularly, the present invention relates to a memory card and a method for manufacturing thereof.

2. Description of Related Art

Currently, the technology and material for forming the electronic integrated circuit is highly developed. The size of the electronic integrated circuit is getting decrease but the functionality of it is getting powerful. The electronic integrated circuit is commercially used in everywhere and the trend of producing the electronic integrated circuit product is to produce much more small and slim products, such as electronic dictionary, digital camera and other digital products. Moreover, since the chip package technology is getting mature, a single chip or multiple chips can be packaged into a very thin card. By utilizing the property of storing mass of digital data in a chip, a removable memory with a size much less than the currently used magnetic recording media can be produced. This kind of electronic media is so called memory card.

FIG. 1 is a cross-section view of a conventional memory card. According to the Taiwan Patent Number 556908, a memory card 100 as shown in FIG. 1 is disclosed. This memory card 100 is constructed from a substrate 110, a plurality of electronic package devices 120 and a molding compound 130. The substrate 110 possesses at least a plurality of outer contacts 112 and a plurality of inner contacts 114, wherein the outer contacts 112 electrically connect to the inner contacts 114 through through-holes 118, respectively. Each through-hole 118 is filled with a stuffing material 116 to prevent moisture intruding from the through-hole 118. Moreover, the electronic package devices 120 are disposed on the substrate 110 and are electrically connected to the inner contacts 114, respectively. Additionally, molding compound 130 covers the substrate 110 to protect electronic package devices 120 and the inner contacts 114 corresponding to the electronic package devices 120.

As shown in FIG. 1, the molding compound 130 of the conventional memory card 100 covers the entire substrate 110. Because the cost of the molding compound 130 is high, the cost of the memory card is increased. Besides, there is stuffing material 116 filled in each through-hole 118 so that the complexity of the process is increased and the cost is increase as well.

SUMMARY OF THE INVENTION

Accordingly, at least one objective of the present invention is to provide a memory card capable decrease the usage of the molding compound so as to decrease the cost of the memory card.

At least a second objective of the present invention is to provide a method for fabricating a memory card to decrease the usage of the molding compound so as to decrease the cost of the memory card.

To achieve these and other advantages and in accordance with the purpose of the invention, as embodied and broadly described herein, the invention provides a memory card. The memory card comprises a substrate, a plurality of electronic package devices, a mold compound and a plastic forming material. The substrate has at least a plurality of outer contacts and a plurality of inner contacts and the outer contacts are electrically connected to the inner contacts. The electronic package devices are located on the substrate and the electronic package devices electrically connect to the inner contacts, respectively. The molding compound is covering the electronic package devices and the corresponding inner contacts. The plastic forming material is covering the molding compound and the substrate, and the plastic forming material exposes the outer contacts.

In the present invention, the memory card can be a secure digital memory card. Additionally, the electronic package devices can be memory package devices or passive devices. The package type of the electronic package devices can be a leadframe type package or a ball grid array type package. Moreover, the electronic package devices electrically connect to the inner contacts by surface mounted technology. Further, the molding compound can be epoxy resin or polyimide. The plastic forming material is selected from the group consisting of polycarbonate, polystyrene, acrylonitrile butadiene styrene and other industrial plastic.

The present invention also provides a method for manufacturing a memory card. The method comprises the steps of providing a substrate having at least a plurality of outer contacts and a plurality of inner contacts, wherein the outer contacts are electrically connect to the inner contacts. A surface mounted technology is performed to electrically connect a plurality of electronic package devices to the inner contacts, respectively. An encapsulation process is performed to cover the electronic package devices and the corresponding inner contacts with a molding compound. An injection molding process is performed to cover the molding compound and the substrate with a plastic forming material, wherein the plastic forming material exposes the outer contacts.

In the present invention, after the injection molding process, the figure of the memory card meets the standards of a secure digital memory card. Moreover, the encapsulation process can be a transfer molding or a dispensing. Moreover, the molding compound only covers a portion of the substrate during the encapsulation process. The electronic package devices can be memory package device or passive devices. Further, the package type of the electronic package devices can be a leadframe type package or a ball grid array type package.

In the present invention, because of the use of molding compound to cover the electronic package devices and corresponding inner contacts and the use of plastic forming material to cover the molding compound and the substrate to expose outer contacts, the usage of molding compound can be decreased so as to decrease the cost of the memory card and to strengthen the structure of the memory card.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
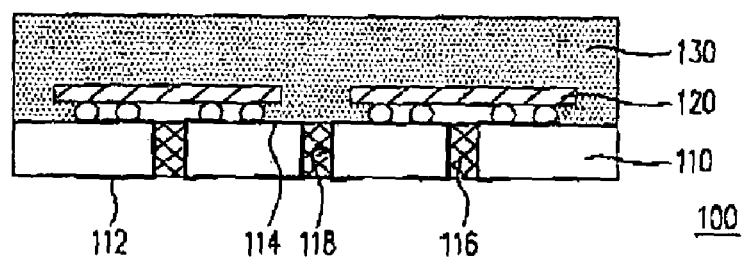
FIG. 1 is a cross-sectional view of a conventional memory card.

Reference will now be made in detail to the present preferred embodiments of the invention, examples of which are illustrated in the accompanying drawings. Wherever possible, the same reference numbers are used in the drawings and the description to refer to the same or like parts.

Figure 2:
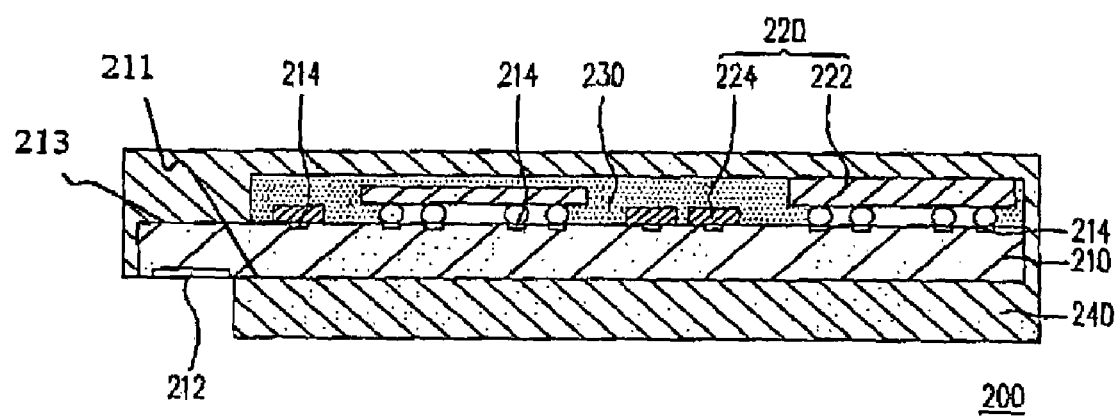
FIG. 2 is a cross-sectional view of a memory card according to a preferred embodiment of the present invention.

FIG. 2 is a cross-sectional view of a memory card according to a preferred embodiment of the present invention. As shown in FIG. 2, the memory card 200 comprises a substrate 210, a plurality of electronic package devices 220, a molding compound 230 and a plastic forming material 240. The substrate 210 possesses at least a plurality of outer contacts 212 and a plurality of inner contacts 214. The outer contacts 212 are configured at a first surface 211 of the substrate 210, and the inner contacts 214 are configured at a second surface 213 of the substrate 210, the first surface 211 and the second surface 213 being opposite to each other. The outer contacts 212 can, for example, electrically connect to the inner contacts 214 through through-holes (not shown) in the substrate 210. The electronic package devices 220 are placed on the surface of the substrate 210 and are electrically connected to the inner contacts 214, respectively. Further, the electronic package devices 220 include memory package devices 222 and passive devices 224. In the embodiment, the package type of the electronic package devices 220 can be a ball grid array (BGA) type package, a leadframe type package or other proper package type.

As shown in FIG. 2, the molding compound 230 covers the electronic package devices 220 and the corresponding inner contacts 214. The molding compound 230 can be, for example, epoxy resin or polyimide. Additionally, the plastic forming material 240 covers the molding compound 230 and substrate 210 to expose the outer contacts 212. The plastic forming material 240, for example, is selected from the group consisting of polycarbonate, polystyrene, acrylonitrile butadiene styrene (ABS) and other proper industrial plastic.

Figure 3A:
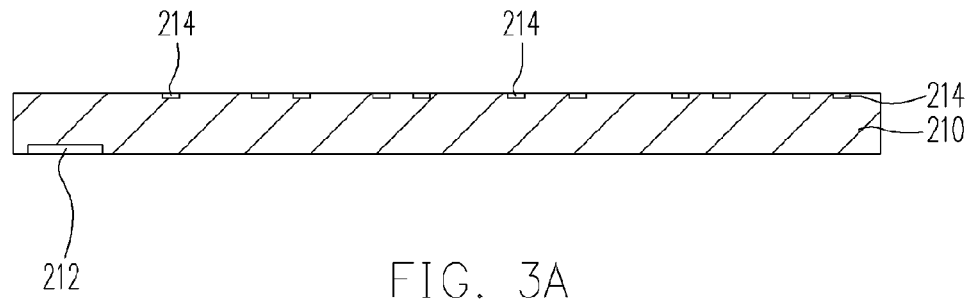
FIGS. 3A through 3C are cross-sectional views showing the steps for manufacturing a memory card according to a preferred embodiment of the present invention.
Figure 3B:
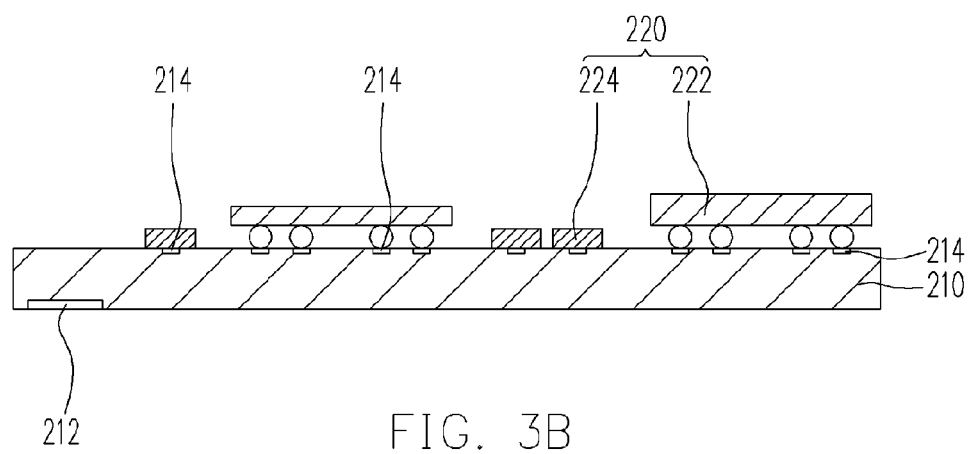
Figure 3C:
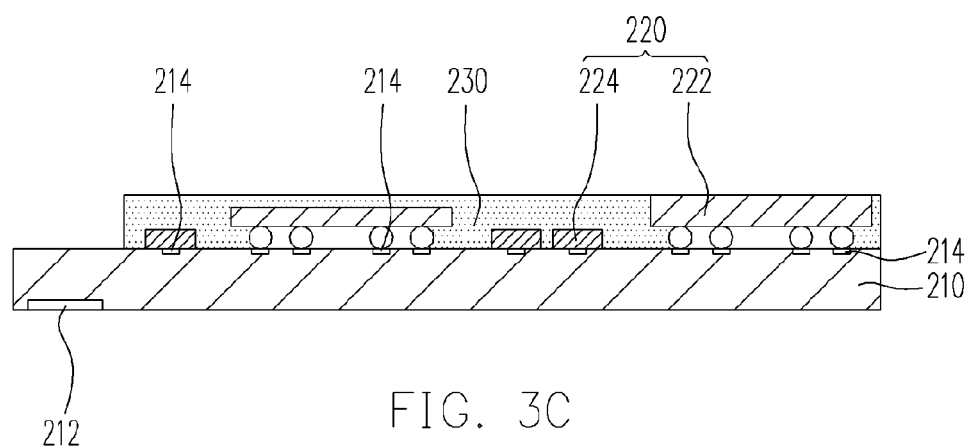

FIGS. 3A through 3C are cross-sectional views showing the steps for manufacturing a memory card shown in FIG. 2 according to a preferred embodiment of the present invention. As shown in FIG. 3A, a substrate 210 is provided, wherein the substrate 210 possesses at least a plurality of outer contacts 212 and a plurality of inner contacts 214. The outer contacts 212 electrically connect to the inner contacts 214. As shown in FIG. 3B, by using the surface mounted technology, electronic package devices 220, such as memory package devices 222 and passive devices 224, electrically connect to the inner contacts 214, respectively.

As shown in FIG. 3C, an encapsulation process is performed to cover the electronic package device 220 and the corresponding inner contacts 214 with a molding compound 230, wherein the molding compound 230 only covers a portion of the substrate 210. The encapsulation process can be a transfer molding or a dispensing. Then, referring FIG. 3C together with FIG. 2, after the encapsulation process, an injection molding process is performed to cover the molding compound 230 and the substrate 210 with a plastic forming material 240 to expose the outer contacts 212.

After the injection molding process, the figure of the memory card 200 can, for example, meet the standards of the secure digital memory card. The standards are established by Japanese corporations, Toshiba and Panasonic, in 1997. Further, the figure of the memory card 200 also can be made to meet the standards of other memory card, such as Compact Flash memory Card (CF Card), Memory Stick Card (MS Card), Memory Stick Duo card (MS Duo Card), SmartMedia Card (SM Card), xD picture card (xD Card), Multi Media Card (MMC), Reduced Size Multi Media Card (RS MMC), Mini Secure Digital card (Mini SD card), μ card, reduced size μ card and other mini memory cards with analogous functions.

In the present invention, the molding compound covers the electronic package devices and the corresponding inner contacts. That is, the molding compound only covers a portion of the substrate. Thereafter, the plastic forming material covers the molding compound and the substrate by using injection molding process to expose outer contacts. The electronic package devices electrically connect to the inner contacts by surface mounted technology, respectively. Altogether, the present invention possesses at least following advantages: (a) the cost can be decrease since the molding compound only covers a portion of the substrate to decrease the usage of the molding compound; (b) after encapsulation process, the plastic forming material and other devices are injected together by injection molding process so as to strengthen the structure of the memory card; (c) the electronic package devices electrically connect to the inner contacts by surface mounted technology so as to decrease the cost of the memory card and to increase the reliability and the yield of the memory card.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A memory card, comprising:
    a substrate having at least a plurality of outer contacts and a plurality of inner contacts, wherein the outer contacts are electrically connected to the inner contacts, wherein the outer contacts are configured at a first surface of the substrate, and the inner contacts are configured at a second surface of the substrate, the first surface and the second surface being opposite to each other;
    a plurality of electronic package devices located on the second surface of the substrate, wherein the electronic package devices are electrically connected to the inner contacts, respectively;
    a molding compound covering the electronic package devices and the corresponding inner contacts; and
    a plastic forming material covering the molding compound and both the first and the second surfaces of the substrate, wherein the plastic forming material exposes the outer contacts.

2. The memory card of claim 1, wherein the memory card includes a secure digital memory card.

3. The memory card of claim 1, wherein the electronic package devices include memory package devices.

4. The memory card of claim 1, wherein the electronic package devices include passive devices.

5. The memory card of claim 1, wherein the package type of the electronic package devices include a leadframe type package.

6. The memory card of claim 1, wherein the package type of the electronic package devices includes a ball grid array type package.

7. The memory card of claim 1, wherein the electronic package devices are electrically connected to the inner contacts by surface mounted technology.

8. The memory card of claim 1, wherein the molding compound includes epoxy resin.

9. The memory card of claim 1, wherein the molding compound includes polyimide.

10. The memory card of claim 1, wherein the plastic forming material is selected from the group consisting of polycarbonate, polystyrene and acrylonitrile butadiene styrene.

* * * * *